United States Patent [19]

Wistrand

[11] Patent Number: 4,812,666
[45] Date of Patent: Mar. 14, 1989

[54] POSITION FEEDBACK ENHANCEMENT OVER A LIMITED REPOSITIONING AREA FOR A MOVEABLE MEMBER

[75] Inventor: Per Wistrand, Binghamton, N.Y.

[73] Assignee: Universal Instruments Corporation, Binghamton, N.Y.

[21] Appl. No.: 97,679

[22] Filed: Sep. 17, 1987

[51] Int. Cl.[4] .............................................. G01N 21/86
[52] U.S. Cl. ........................................ 250/561; 901/47
[58] Field of Search ................ 250/561, 560; 356/400, 356/401; 901/47

[56] References Cited

U.S. PATENT DOCUMENTS 4,233,625  11/1980  Altman ................................. 356/400
4,676,649  6/1987  Phillips .................................. 356/401

Primary Examiner—David C. Nelms
Attorney, Agent, or Firm—Franklin D. Wolffe; Morris Fidelman

[57] ABSTRACT

The invention is directed to a method and apparatus for providing an auxiliary feedback of the position of a pick and place spindle during multi-image repositioning of the spindle at the inspection station, wherein the auxiliary feedback is sufficiently precise to meet lead inspection requirements which are not met by the existing encoder. The auxiliary feedback is achieved by attaching a mapping plate with very accurately spaced reference marks onto the pick and place head and by mounting a second sufficiently precise camera adjacent the inspection station so that at least one reference mark or fiducial of the mapping plate is always in the field of view of the second camera while the component is at the inspection station.

6 Claims, 2 Drawing Sheets

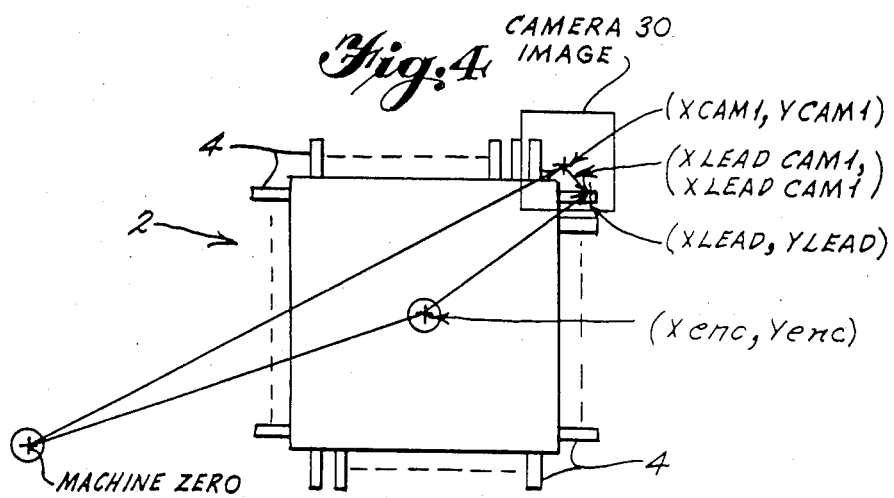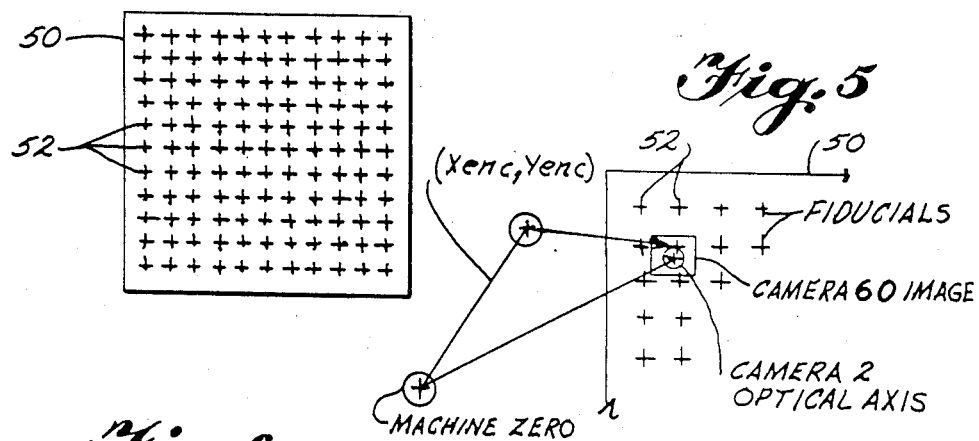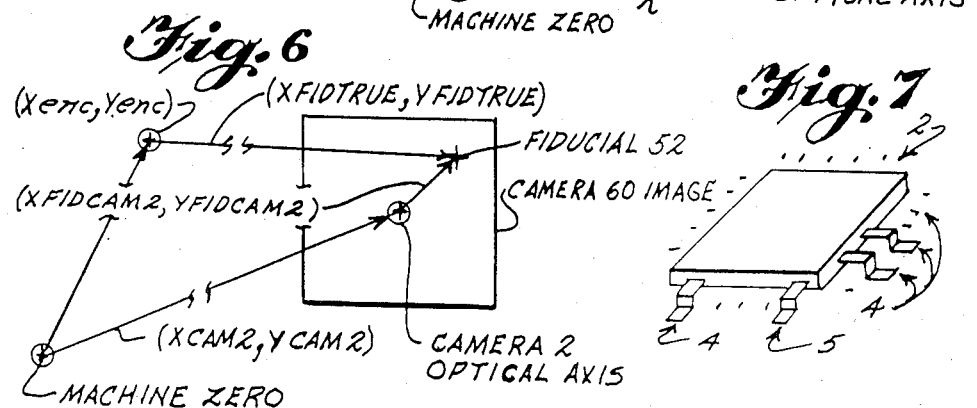

POSITION FEEDBACK ENHANCEMENT OVER A LIMITED REPOSITIONING AREA FOR A MOVEABLE MEMBER

BACKGROUND AND SUMMARY OF THE INVENTION

This invention relates to the feedback of an X-Y positioning system, and particularly to a method and apparatus for improving precision of the position feedback over a limited area of the system.

For purposes of this disclosure, the following definitions apply:

Precision is defined as the smallest detectable position change. In an encoder, such a change is measured by the distance between pulses. In a vision system, we estimate that the smallest detectable distance is about half of a picture element (pixel) in a camera image. In a mechanical sensor gage, the precision is the least sensor movement which provides a detectable output change.

Accuracy is how close a desired position is to a true position, with measurement accuracy being the closeness of a measured quantity to the true quantity.

When picking up a component with the spindle of a pick and place head or the like and moving it in X and Y to a placement location at which the leads of the component are to be attached to corresponding conductive pads of a circuit board, it is often beneficial to transport the component to an inspection station intermediate the pick up and placement stations in order to determine the part's position and orientation relative to the spindle axis and then correct for any misalignment before placement. Often it is desirable to inspect the component also in order to determine whether all the lead positions and orientation are good compared to a nominal set of positions and orientations, and/or to measure the lead positions relative to each other very accurately.

In a typical case, it has been required to pick and place a four sided flat pack electrical component with correspondence between each lead and solder pad of 0.002–0.003 inches, wherein 0.014 inch wide leads extend from each of the sides at nominal center distances of 0.025 inches. A positioning system having a feedback encoder with a precision of 0.0005 inches is adequate for this purpose when no intermediate stop for inspection is necessary.

Additionally, a requirement for inspection of lead positions and orientations with a particular precision, say 0.0002 inches, can be performed at an intermediate inspection station using a camera 30 connected to a vision system 40 if both conditions are satisfied that the precision of the combined camera 30 and vision system 40 is equally or more precise than the particular 0.0002 inches, and that the whole component 2 (including leads 4) can be captured in one image of camera 30.

However with the present technology, the number of camera pixels in one image is limited for practical purposes, and several images may be necessary to inspect all the leads 4 of a component 2 with the required precision. Thus, the spindle 26 must be repositioned relative to the inspection camera 30 so as to reposition the component 2 and obtain successive different images of different portions of the component 2. Because of such repositioning, it is then necessary to know the position of spindle 26 relative to the camera 30 with a precision better than the required lead inspection precision so as to correctly determine the positions of the leads 4 in relation to each other.

From FIG. 4, it may be seen that the following vector assignments apply.

$\{X_{lead}, Y_{lead}\}$ is the position of a reference point of a lead 4 relative to the axis of spindle 26.

$\{X_{cam1}, Y_{cam1}\}$ is the position of the optical axis of inspection camera 30 relative to machine zero.

$\{X_{leadcam1}, Y_{leadcam1}\}$ locates the lead relative to the optical axis of inspection camera 30.

By vector analysis, the lead position may be expressed as:

$$X_{lead} = X_{cam1} + X_{leadcam1} - X_{enc} \quad (1)$$

$$Y_{lead} = Y_{cam1} + Y_{leadcam1} - Y_{enc} \quad (2)$$

Thus, $X_{lead}$, $Y_{lead}$ accuracy cannot be better than any of the component parts of equations (1) and (2), and (i) $X_{cam1}$ and $Y_{cam1}$ are constant (and fixed relative to machine zero) and will not affect the relative measurement accuracy between leads.

(ii) $X_{leadcam1}$ and $Y_{leadcam1}$ are known with the precision obtainable with the inspection camera 30/vision system 40.

(iii) $X_{enc}$ and $Y_{enc}$ are known with the precision obtainable by the encoder.

In a particular case, a precision of 0.0002 inches is obtainable by camera 30/vision system 40, while the position information obtainable by encoder 22 of X-Y positioning system 20 is 0.0005 inches. Thus, the position of spindle 26 obtainable by encoder 22 is the least precise of the component parts (i)–(iii).

If we can inspect the leads with only one image of inspection camera 30, then encoder precision of 0.0005 inches is sufficient for positioning the component 2 at camera 30, since the encoder error will have the same effect on all of the leads relative to camera 30 when only inspecting the positions and orientations of all leads 4 relative to each other or to a nominal lead pattern.

The encoder error cannot be avoided when we are concerned with the positions and orientations of the leads 4 in X,Y, and $\theta$ relative to spindle 26, as in the situation where the spindle is repositioned to a placement location 8 for placement of the component 2 onto circuit board 6 with sufficient registration between each lead 4 and a solder pad 10. However, since the accuracy requirements for this registration between leads 4 and solder pads 10 is only 0.002–0.003 inches, the encoder error is acceptable.

As described above, the limitations of the camera 30 require that spindle 26 be repositioned relative to camera 30 for presentation of different leads 4 to the field of view of camera 30 so that several different images are required for inspection of the whole component 2. With such repositioning of spindle 26, the encoder error contained in $X_{ENC}$ and $Y_{ENC}$ cannot be avoided during the inspection process. Since the encoder precision of 0.0005 inches does not meet the required precision of 0.0002 inches for lead inspection, encoder 22 is inadequate for multi-image inspection of a component.

Accordingly, it is an object the invention is to provide a method and apparatus for overcoming this shortcoming while retaining the existing encoder.

SUMMARY OF THE INVENTION

The invention is directed to a method and apparatus for providing an auxiliary feedback of the position of a pick and place spindle during multi-image repositioning of the spindle at the inspection station, wherein the auxiliary feedback is sufficiently precise to meet lead inspection requirements which are not met by the existing encoder. The auxiliary feedback is achieved by attaching a mapping plate having very accurately spaced reference marks onto the pick and place head and by mounting a second sufficiently precise camera adjacent the inspection station so that at least one reference mark or fiducial of the mapping plate is always in the field of view of the second camera while the component is at the inspection station.

BRIEF DESCRIPTION OF THE DRAWINGS

FIG. 3 is a top plan view of a mapping plate with fiducials.

FIG. 4 is an enlarged top plan view of an electrical component, and further illustrating its position relative to the pick and place spindle and the field of view of the inspection camera.

FIG. 5 is a partial enlarged view illustrating the use of a mapping plate and second camera for auxiliary position feedback of the spindle.

FIG. 6 is a further enlargement of the illustration of FIG. 5.

FIG. 7 is an isometric view of a surface mountable electric component to illustrate the lead inspection reference point at the intersection of the center line and outer edge of the lead.

DETAILED DESCRIPTION OF THE INVENTION

Figure 1:
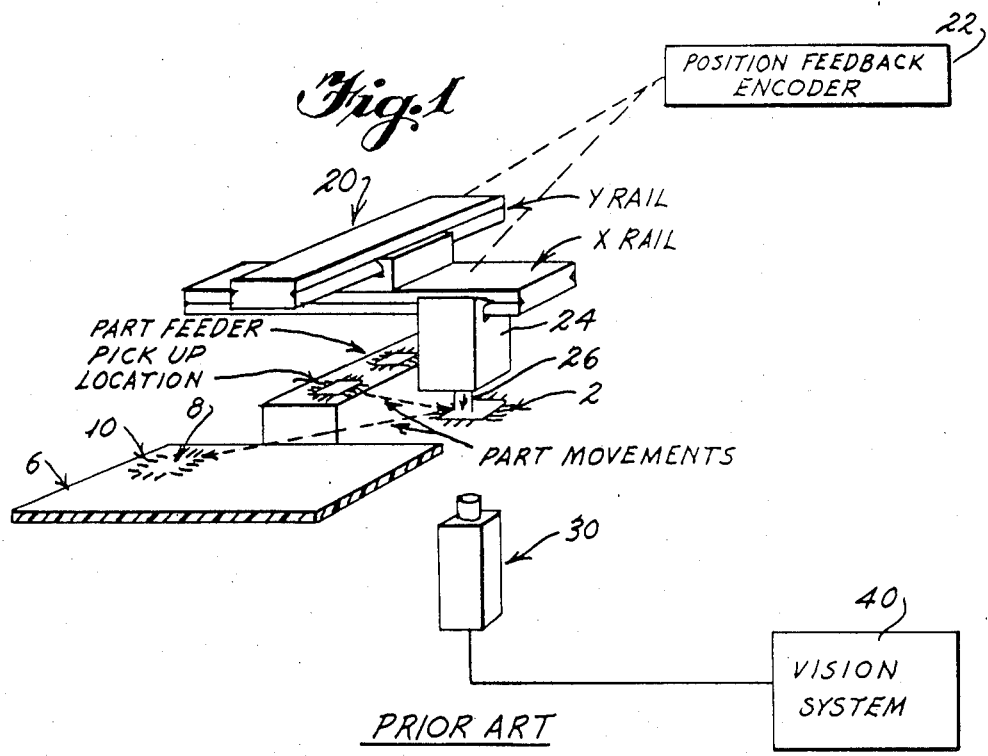
FIG. 1 is an isometric view illustrating the prior art.

Referring to FIG. 1, an X-Y positioning system 20 comprising an X rail and Y rail for X and Y positioning of a pick and place head 24 and the vacuum spindle 26 thereof, with the location of the spindle 26 being read or detected by a position feedback encoder 22. This type of apparatus is often used to retrieve a component from a supply at a pick up location and to transport it to a printed circuit board at a placement location with an intermediate stop at an inspection camera 30. The inspection camera 30 is for inspecting leads 4 of a component 2 and their relation in X, Y, and $\theta$ to a nominal pattern stored in the computer memory of a vision system 40 to which inspection camera 30 is attached.

Figure 2:
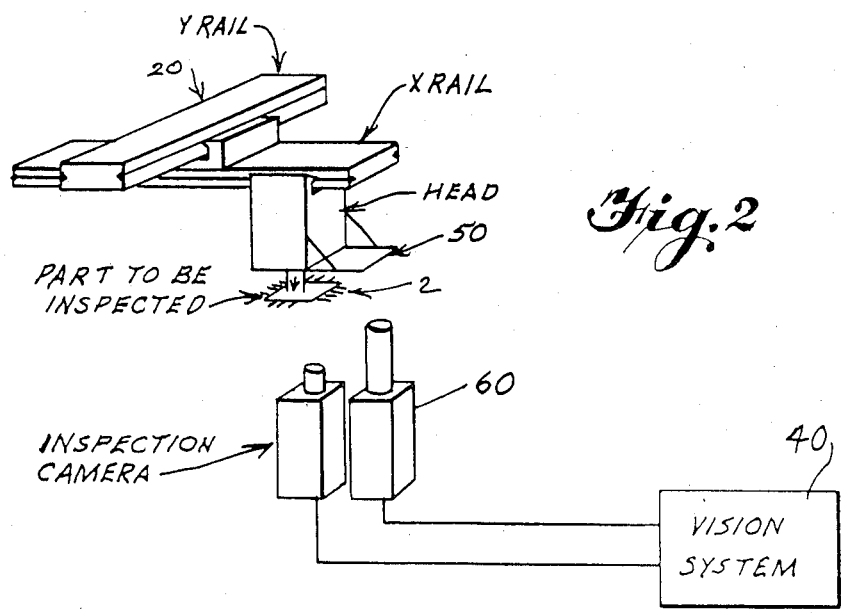
FIG. 2 is a view similar to FIG. 1, illustrating the addition of apparatus of the invention to the prior art.

The reader's attention is directed to FIG. 2 for the case where the component 2 must be repositioned several times within the field of view of inspection camera 30 in order to inspect all of the leads with a precision better than that provided by encoder 22. A mapping plate 50 is fixedly attached to the pick and place head 24 for movement therewith and a second camera 60 is fixedly positioned adjacent inspection camera 30 such that a fiducial 52 of mapping plate 50 is always within the field of view of camera 60 when component 2 is positioned above inspection camera 30.

Mapping plate 50 and fiducials 52 thereof are best illustrated in FIG. 3, and the mapping plate may be a 2.4 inch by 2.4 inch plate with 121 reference marks averaged very accurately in a matrix with 0.2 inch center distances. Auxiliary camera 60 may have an optical magnification such as to provide a precision of 0.0001 inches per pixel, and it may share vision system 40. With a vision system capable of a precision of half a pixel, the resulting combination has a precision of 0.00005 inches, ten times better than the encoder precision. The encoder feedback precision of 0.0005 inches is sufficient to determine which fiducial 52 of the mapping plate 50 is closest to the optical axis of auxiliary camera 60.

Referring to FIGS. 5 and 6, it may be seen that the following vector assignments apply:

$\{X_{cam2}, Y_{cam2}\}$ is the fixed position of the optical axis of auxiliary camera 60 relative to machine zero.

$\{X_{fidtrue}, Y_{fidtrue}\}$ is the fixed true fiducial position relative to the axis of the spindle 26.

$\{X_{fidcam2}, Y_{fidcam2}\}$ is the measured fiducial position relative to the optical axis of auxiliary camera 60.

By vector analysis, the improved spindle position may be expressed as:

$$X_{enc}' = X_{cam2} + X_{fidcam2} - X_{fidtrue} \tag{3}$$

$$Y_{enc}' = Y_{cam2} + Y_{fidcam2} - Y_{fidtrue} \tag{4}$$

Thus, by substituting equations (3) and (4), respectively into equations (1) and (2), the lead position may be expressed as:

$$\begin{aligned}
X_{lead} &= X_{cam1} + X_{leadcam1} - X_{enc}' \\
&= X_{cam1} + X_{leadcam1} - X_{cam2} + X_{fidtrue} - X_{fidcam2} \\
&= X_{cam1} - X_{cam2} + X_{leadcam1} + X_{fidtrue} - X_{fidcam2}
\end{aligned} \tag{5}$$

$$\begin{aligned}
Y_{lead} &= Y_{cam1} + Y_{leadcam1} - Y_{enc}' \\
&= Y_{cam1} + Y_{leadcam1} - Y_{cam2} + Y_{fidtrue} - Y_{fidcam2} \\
&= Y_{cam1} - Y_{cam2} + Y_{leadcam1} + Y_{fidtrue} - Y_{fidcam2}
\end{aligned} \tag{6}$$

The errors in the lead position measurement according to equations (5) and (6) are:

(i) the error in the differences $X_{cam1} - X_{cam2}$ and $Y_{cam1} - Y_{cam2}$, which is constant for all the images, and thus does not affect the measurement of the leads in relation to each other.

(ii) the error in the measured lead position, $\{X_{leadcam1}, Y_{leadcam1}\}$ in relation to the optical axis of camera 30, which is measured with a of 0.0002 inches.

(iii) the error in the true fiducial position. Mapping plate 50 can be made with a very high precision, so the relative positions of the fiducials 52 in relation to each other can be as accurate as 0.00005 inches, for instance. What may remain is a constant error for the position of the whole mapping plate 50 in relation to the spindle 26, but this error is constant for all the images and thus does not affect the measurement of the leads' in relation to each other.

(iv) the error in the measured fiducial position $\{X_{fidcam2}, Y_{fidcam2}\}$ in relation to the optical axis of auxiliary camera 60, which is measured with a precision of 0.00005 inches.

Since the non constant error term that dominates is (ii) the error in the lead position measurement, and since the other non constant error terms are substantially smaller, the precision of the result is going to be roughly the same as the precision in the lead measurement relative to the camera, i.e., 0.0002 inches. From this, the accuracy in the lead position measurement relative to the other leads can be expected to be better than +/−0.0003 inches.

Without the invention, using the existing encoder 22 as the only reference, the encoder precision and other errors in the positioning systems would result in a total accuracy in the lead position inspection of only 0.001–0.003 inches (depending on how the encoder follows the true repositioning of spindle 26 and the like).

By use of the invention, the total error involved in chip placement is reduced over that without use of the invention because the knowledge of the position and orientation of the lead pattern relative to the central axis of the spindle 26 is much more precise than that achieved without the invention. With the invention, the placement error is dominated by the encoder error when the spindle is moved away from the inspection station and auxiliary camera. Encoder errors which are non critical are encountered prior to establishing the exact location of the leads at the inspection station.

The vision system includes a computer system which can decode the image and tell us where a reference line or point of the inspected work is relative to the optical axis of the camera. By finding all of the lead locations relative to a reference such as the longitudinal axis of spindle 26 and by comparing the actual lead pattern to a nominal lead pattern such as by use of a leads fitting program of the vision system, the spindle may be corrected in X, Y and $\theta$ in order to match the leads with the corresponding pattern of solder pads at the placement location on the circuit board. Still further, by use of such a leads fitting program, it is possible to determine a placement error for each lead/pad interface according to such a spindle correction so that acceptance or rejection of the component may be made as soon as the component is inspected. A typical criteria for acceptance or rejection of the component after spindle correction is that each lead have at least a 75 percent overlap with the corresponding solder pad.

The vision system 40 may comprise an AISI model 3000 manufactured by Applied Intelligence Systems, Inc. of Ann Arbor, Mich., and the cameras were NEC model TI23A distributed by Nippon Electrical Company, 130 Martin Lane, Elk Grove Village, Ill. 60007.

The encoder 22 and vision system 40 are operatively associated with each other by means of a computer or the like. In a prototype of the invention, the overall machine control was by several Motorola 68000 computers connected together by a VME-type bus, with one of them controlling the positioning system with the encoder feedback and communicating the detected position to the computer which controls the vision system.

Having described the invention, it will be seen that the objects set forth above, among those made apparent from the preceding description, are efficiently obtained and, since certain changes may be made in carrying out the above method and in the construction set forth without departing from the scope of the invention, it is intended that all matter contained in the above description or shown in the accompanying drawings shall be interpreted as illustrative and not in a limiting sense. For instance, it is considered well within the concept of the invention that the mounting of the auxiliary camera and the mapping plate may be interchanged. Adaptation of the auxiliary feedback system of the invention to other positioning systems is also intended to be covered by this disclosure and appended claims.

Further, it is considered to be within the context of the invention that the mapping plate may be of sufficient size that the fiducials thereof fall within the field of view of the auxiliary camera during pick up and/or placement of the component so as to replace or augment the existing encoder for these functions also.

It is also to be understood that the following claims are intended to cover all of the generic and specific features of the invention described herein, and all statements of the scope of the invention, which as a matter of language, might be said to fall therebetween.

Now that the invention has been described, we claim:

1. A method of improving the precision of position recognition of a moveable spindle axis of a positioning system over that of an existing position feedback for the system within a particular area of repositioning of the axis, and comprising the steps of:

providing a mapping plate having an array of fiducials spaced sufficiently close together as to be locatable within a camera field of view by said existing positioning feedback and attaching said plate in fixed relation to said moveable axis;

providing a camera and vision system operatively as therewith which together are more precise than said existing position feedback system, and mounting said camera in fixed relation to a home reference of said positioning system;

situating said camera such that at least one of said fiducials is within a field of view of said camera over at least a limited area of repositioning of said axis;

determining a location of said axis within at least said limited area by said camera and vision system more precisely than obtainable by said encoder above.

2. A method of inspecting component lead positions and orientations relative to a reference with more precision than obtainable by an existing encoder of a positioning system which handles said components, comprising the steps of:

providing a mapping plate having an array of fiducials spaced sufficiently close together as to be locatable within a camera field of view by said existing encoder and attaching said plate in fixed relation to a moveable axis of said positioning system;

providing a camera and vision system operatively associated therewith which together are more precise than said existing encoder, and mounting said camera in fixed relation to a home reference of said positioning system;

situating said camera such that at least one of said fiducials is within a field of view of said camera over at least a limited area of repositioning of said moveable axis;

determining by said encoder which particular fiducial is closest to an optical axis of said camera; and determining the location of said moveable axis, indirectly and with more precision than obtainable by said encoder alone, by locating said fiducial relative to said camera optical axis with a precision obtainable by said camera and vision system, and utilizing the fixed relations between said fiducial and said moveable axis and between said camera optical axis and said home reference of said positioning system.

3. An apparatus for improving the precision of position recognition of a moveable spindle axis of a positioning system over that of an existing position feedback for the system within an area of repositioning of the axis, and comprising:

a mapping plate fixed in relation to said moveable axis and having an array of fiducials spaced sufficiently close together as to be locatable within a camera field of view by said existing positioning feedback;

a camera and vision system operatively associated therewith, which together are more precise than said existing position feedback system, said camera mounted in fixed relation to a home reference of said positioning system; and said camera being situated such that at least one of said fiducials is within a field of view of said camera over at least a limited area of repositioning of said axis;

whereby said camera and vision system obtain a location of said axis within at least said limited area by more precisely than obtainable by said encoder alone.

4. An apparatus for inspecting component lead positions and orientations relative to a reference with more precision than obtainable by an existing encoder of a positioning system which handles said components, comprising:

a mapping plate fixed in relation to said moveable axis and having an array of fiducials spaced sufficiently close together as to be locatable within a camera field of view by said existing positioning feedback;

a camera and vision system operatively associated therewith, which together are more precise than said existing position feedback system, said camera being mounted in fixed relation to a home reference of said positioning system, such that at lease one of said fiducials is within a field of view of said camera over at least a limited area of repositioning of said axis;

means for determining by said encoder which particular fiducial is closest to an optical axis of said camera; and means for determining the location of said axis, indirectly and with more precision than obtainable by said encoder along, by locating said fiducial relative to said camera optical axis with a precision obtainable by said camera and vision system, and utilizing the fixed relations between said fiducial and said axis and between said camera optical axis and said home reference of said positioning system.

5. In an apparatus for picking and placing a component by means of an X-Y moveable spindle of a positioning system in which each position of the spindle is detectable by an encoder of a particular precision, the improvement comprising:

an auxiliary means for detecting positions of said spindle, within at least a limited area generally perpendicular to said spindle, more precisely than obtainable by said encoder, said auxiliary detecting means comprises a camera and operatively associated vision system which together provide a precision equal to or better than a position feedback precision required within said limited area; and a reference device which is fixed to said spindle so as to be within a detection range of said auxiliary detecting means when said spindle is positioned within said limited area, said reference device comprising a mapping plate having an array of fiducials and being located by said encoder with sufficient precision for detection by said auxiliary detecting means.

6. The improvement as in claim 5, and further comprising:

an additional camera operatively associated with said vision system and situated with a field of view within said limited area for inspection of component leads.

* * * * *